United States Patent Office 2,981,611

Patented Apr. 25, 1961

2,981,611

MANUFACTURE OF PRINTED ELECTRICAL CIRCUITS OR COMPONENTS

Fred Ashworth, Sale, England, assignor to Metropolitan-Vickers Electrical Company Limited, London, England, a British company No Drawing. Filed Mar. 12, 1957, Ser. No. 645,404

Claims priority, application Great Britain Mar. 14, 1956

1 Claim. (Cl. 41—43)

This invention relates to the manufacture of printed electrical circuits or components and is more particularly concerned with forming printed electrical circuits on a backing of flexible insulating material.

It is known to construct printed circuits by processes involving bonding a metal foil on to a base surface, printing the required pattern as a resist on to the metal and removing the unwanted metal not underlying the resist, such removal being effected, for instance by etching with acid. Whilst such processes are suitable for many applications it has been found difficult to effect satisfactory bonding of the metal to the backing in cases in which this is formed by a flexible insulating material.

The main object of the invention is to form printed electrical circuits in which the materials are firmly bonded to a flexible insulating backing.

The method according to the invention consists in manufacturing printed electrical circuits and circuit components comprising the steps of curing a flexible silicone-varnish impregnated glass-cloth at a high temperature e.g. 350° C. for a prolonged period e.g. one hour to ensure complete cure, printing thereon a negative of the required circuit or component, depositing a conductive, semi-conductive or resistive layer of material capable of bonding with the glass cloth by vacuum deposition all over the printed and exposed areas of the glass cloth, and dissolving the printing and superimposed material so as to leave the required pattern of deposited material bonded to the glass cloth.

The electrical circuitry material deposited may, for example, be a conductor, e.g. metal or a resistor or a semi-conductor.

It has been found that bonding of vacuum deposited materials to the glass cloth is much more effective when the curing is carried to an extent at which substantially complete polymerization of the silicone-varnish has occurred and it is for this purpose that the curing is carried out for prolonged periods at a high temperature.

The printing of the negative resist may be carried out in any suitable form, such as a rotary lithographic process using an appropriate printer's ink. Screen printing and letter press techniques may also be employed.

Suitable conductor materials for depositing to form the conductors are silver, copper, aluminum and a nickel-chromium alloy.

The vacuum deposition process may be effected for instance by the evaporation of the material from a heated molybdenum or tungsten filament or from a crucible heated by radio-frequency induction.

The invention may be employed for forming complex electrical circuitry such as grids for instance, by depositing a series of parallel conductor lines. It may also be employed in constructing components such as inductances and capacitors. Inductances may be formed by forming a series of patterns such as spirals, on sheets which are stacked to form an inductance, or alternatively, on a single sheet which is rolled on a former. Capacitors may be formed by depositing areas of conducting material on sheets of silicone-bonded glass cloth which are placed together with an intervening dielectric such as for instance, another sheet of glass cloth, or by depositing conducting material on both opposing sides of one sheet of silicone-bonded glass cloth which acts as a dielectric.

Semi-conductors and resistor layers may also be deposited.

Electrical components and the associated circuitry may be formed by the multiple deposition of layers which constitute both components and the connections to them, respectively.

What I claim is:

A method of manufacturing printed electrical circuits including components comprising the steps of heating a flexible silicone-varnish impregnated glass cloth at a temperature of 350° C. for about one hour so as to effect substantially complete polymerization of the silicone-varnish to impart to said glass cloth a smooth surface of silicone varnish which is highly resistant to an organic solvent while retaining the flexibility of the glass cloth, printing on the surface of said glass cloth with a soluble material a negative of the required circuits and components, applying by vacuum deposition a coating of electrical circuitry material which bonds directly with the surface of the glass cloth over all the printed and exposed areas of the surface of the glass cloth, and removing said soluble material by dissolving it in said organic solvent and thereby removing those portions of said coating of said electrical circuitry material which have been applied on said soluble material.

References Cited in the file of this patent

UNITED STATES PATENTS

| | | |
|---|---|---|
| 1,837,678 | Ryder | Dec. 22, 1931 |
| 2,139,640 | Mall et al. | Dec. 6, 1938 |
| 2,473,183 | Watson | June 14, 1949 |
| 2,519,785 | Okolicsanyi | Aug. 22, 1950 |
| 2,559,969 | Kennedy | July 10, 1951 |
| 2,633,428 | Klug | Mar. 31, 1953 |
| 2,643,320 | Plenninger | June 23, 1953 |
| 2,702,274 | Law | Feb. 15, 1955 |
| 2,705,749 | Daily et al. | Apr. 5, 1955 |
| 2,717,219 | Ford et al. | Sept. 6, 1955 |
| 2,717,220 | Fay | Sept. 6, 1955 |
| 2,845,364 | Waggoner | July 29, 1958 |

OTHER REFERENCES

Formica Copper Clad, Formica Co., 1954 (page 3).

Modern Plastics, April 1954 (vol. 31, No. 8), pp. 92, 95 and 218.